United States Patent [19]

McKinnon et al.

[11] Patent Number: 5,235,278

[45] Date of Patent: Aug. 10, 1993

[54] MAGNETIC RESONANCE SPECTROSCOPY METHOD AND DEVICE FOR PERFORMING THE METHOD

[75] Inventors: Graeme McKinnon, Zürich; Peter Bösiger, Ennetbaden, both of Switzerland

[73] Assignee: U.S. Philips Corp., New York, N.Y.

[21] Appl. No.: 817,021

[22] Filed: Jan. 3, 1992

[30] Foreign Application Priority Data

Jan. 24, 1991 [DE] Fed. Rep. of Germany ....... 4102023

[51] Int. Cl.$^5$ .............................................. G01R 33/20
[52] U.S. Cl. ..................................... 324/309; 324/307
[58] Field of Search ............... 324/300, 307, 309, 318, 324/322

[56] References Cited

U.S. PATENT DOCUMENTS 5,077,524 12/1991 Hurd et al. ........................... 324/318
5,111,143 5/1992 McKinnon et al. ................. 324/307

OTHER PUBLICATIONS

A. Bax et al., "Separation of the Different Orders of NMR Multiple-Quantum Transitions by the Use of Pulsed Field Gradients", Chemical Physics Letters, vol. 69, No. 3, Feb. 1, 1990, pp. 567–570.
D. M. Freeman et al., "Monitoring Steady State Tumor Lactic Acid Levels In Vivo in Different Tumor Cell Lines Using Two-Dimensional Double Quantum Coherence Transfer Spectroscopy", SMRM Abstracts, San Francisco, (1988), pp. 212.

*Primary Examiner*—Michael J. Tokar
*Attorney, Agent, or Firm*—Jack D. Slobod

[57] ABSTRACT

A plurality of sequences act on an examination zone in the presence of a uniform, steady magnetic field, each of the sequences comprising at least three RF pulses which are preferably formed as 90° pulses, applying between the second and the third RF pulse and after the third RF pulse magnetic gradient fields ($G_x$) having an amplitude and a duration such that spin resonance signals occurring after the third RF pulse are determined exclusively by double quantum coherence. Thus, spatial and spectral determination of a lactate component is simultaneously possible when it is ensured that at least one magnetic gradient field is applied between or after the three RF pulses and when the time integral over at least one of these gradient fields is varied during repetition of the sequences, the second RF pulse ($HF_2$) being frequency selective to reduce the lipid component ($L_1$) near the lactate component ($M_1$) so that the nuclear magnetization of the component ($M_2$) coupled to the lactate component ($M_1$) is excited, but not the nuclear magnetization of the component ($L_2$) coupled to the lipid component ($L_1$).

20 Claims, 3 Drawing Sheets

MAGNETIC RESONANCE SPECTROSCOPY METHOD AND DEVICE FOR PERFORMING THE METHOD

FIELD OF THE INVENTION

The invention relates to a magnetic resonance spectroscopy method in which a plurality of sequences is applied to an examination zone in the presence of a uniform, steady magnetic field, each sequence comprising at least three preferably 90° RF pulses, between the second and the third RF pulse as well as subsequent to the third RF pulse there being applied magnetic gradient fields having an amplitude and duration such that spin resonance signals occurring subsequent to the third RF pulse are determined exclusively by double quantum coherence. The invention also relates to a device for performing this method.

BACKGROUND OF THE INVENTION

A method of this kind is known from SMRM Abstracts (San Fransisco, 212 (1988)) and from Chem. Phys. Lett., 69 (1980), pp. 567-570. According to the known method, a magnetic gradient field is switched on and off before and after the last RF pulse. The time integral over this field after the last pulse amounts to exactly twice the corresponding integral before this pulse. It is thus achieved that only double quantum coherences influence the spin resonance signal. Single quantum coherences, notably the signals originating from water-bound protons, are then strongly suppressed.

In the cited SMRM publication this method is used to determine the concentration of lactic acid or lactate independently from the concentration of fat or lipids. The Larmor frequencies of protons bound to fat and to lactic acid are very close to one another. In order to enable separation of these two components, according to the known method a two-dimensional frequency spectrum is generated. To this end, the so-called evolution time between the second and the third RF pulse is varied in steps, the spin resonance signals thus acquired being used to derive therefrom a two-dimensional frequency spectrum by way of two-dimensional Fourier transformation, fat and lactic acid being suitably separable in the spectrum.

Two-dimensional frequency spectra require very long overall measuring periods and are susceptible to motions in the examination zone. Therefore, it would be worthwhile to pursue determination of the lactic acid concentration independently from the fat concentration in a one-dimensional frequency spectrum. This is hampered by the fact that one frequency component of protons bound to lactic acid is situated in the immediate vicinity of the Larmor frequency of water-bound protons, and that the other frequency component of lactic acid directly neighbors a fat component which is also contained in the double quantum spectrum.

SUMMARY OF THE INVENTION

It is an object of the present invention to conceive a method of the kind set forth so that the lipid component which is substantially coincident with the lactate component in the frequency spectrum is substantially reduced and the spatial distribution of the nuclear magnetization can be determined in at least one dimension at the same time.

This object is achieved in accordance with the invention in that between the three RF pulses there is applied at least one magnetic gradient field, the time integral over the at least one gradient field being varied during repetition of the sequences repeated, the second RF pulse being frequency selective in order to reduce the lipid component in the vicinity of the lactate component so that it excites the nuclear magnetization of the components coupled to the lactate component but not the nuclear magnetization of the component coupled to the lipid component.

The invention is based on the following considerations. During a sequence of the method described above, the second RF pulse can excite double-quantum transitions, notably when it is situated at a defined distance in time, ($\frac{1}{4}J$) or an odd multiple thereof, from the first RF pulse, J being the scalar coupling constant. Such a double-quantum transition itself does not give rise to a measurable spin resonance signal, but the third RF pulse brings the double-quantum transition in a state in which it supplies a measurable signal. When the second RF pulse is rendered frequency-selective so that it is not "seen" by the element coupled to the lipid component, but rather by the component coupled to the lactate component, double-quantum states of the disturbing lipid component will not be excited. Consequently, in the double-quantum spectrum the lipid component which registers substantially with the lower frequency component of lactic acid is substantially suppressed and the lactic acid concentration can be determined substantially without being influenced by the fat contents.

Because at least one magnetic gradient field whose time integral is varied upon repetition of the sequence is applied between the three RF pulses, phase encoding is achieved, enabling (after a Fourier transformation in respect of the time integral of this gradient the nuclear magnetization distribution to be spatially determined in at least one dimension.

If the second RF pulse were a "hard" pulse, i.e. a pulse which is not frequency-selective, notably the relative phase position of the first two RF pulses relative to the spin vector of the excited nuclear spins would be important. The sequence would then be very susceptible to location-dependent phase shifts caused by eddy currents due to the switching on and off of the gradient fields. For example, if the first RF pulse were slice selective, such a sequence could hardly be used for in vivo examinations.

Because the sound RF pulse is frequency-selective, the phase relationship between the first two RF pulses and the spin vectors of the excited nuclear magnetization is unimportant. Therefore, for example during the first RF pulse or between the first and the second RF pulse a magnetic gradient field may be applied without giving rise to artefacts. Therefore, this sequence is very firm and also suitable for in vivo examinations.

Therefore, in a further version of the invention the gradients serving for phase encoding are applied between the first and the second RF pulse. Depending on whether one, two or three magnetic gradient fields which are varied as regards amplitude or duration are applied during repetition of the sequence, a one-dimensional, two-dimensional or three-dimensional image of the spatial distribution of the nuclear magnetization is thus obtained. To this end, the spin resonance signals received in relation to the sequences must be subjected not only to a Fourier transformation in respect of time, but also to a one-dimensional, two-dimensional or three-dimensional Fourier transformation, respectively, in respect of the time integral of the magnetic gradient field.

The first RF pulse may be slice-selective. The image of the nuclear magnetization distribution is then limited to one slice. The eddy currents involved with this magnetic gradient field do not cause artefacts, as has already been stated, because the second RF pulse is frequency selective.

BRIEF DESCRIPTION OF THE DRAWING

The invention will be described in detail hereinafter with reference to the drawing. Therein.

DESCRIPTION OF THE PREFERRED EMBODIMENT

Figure 1:
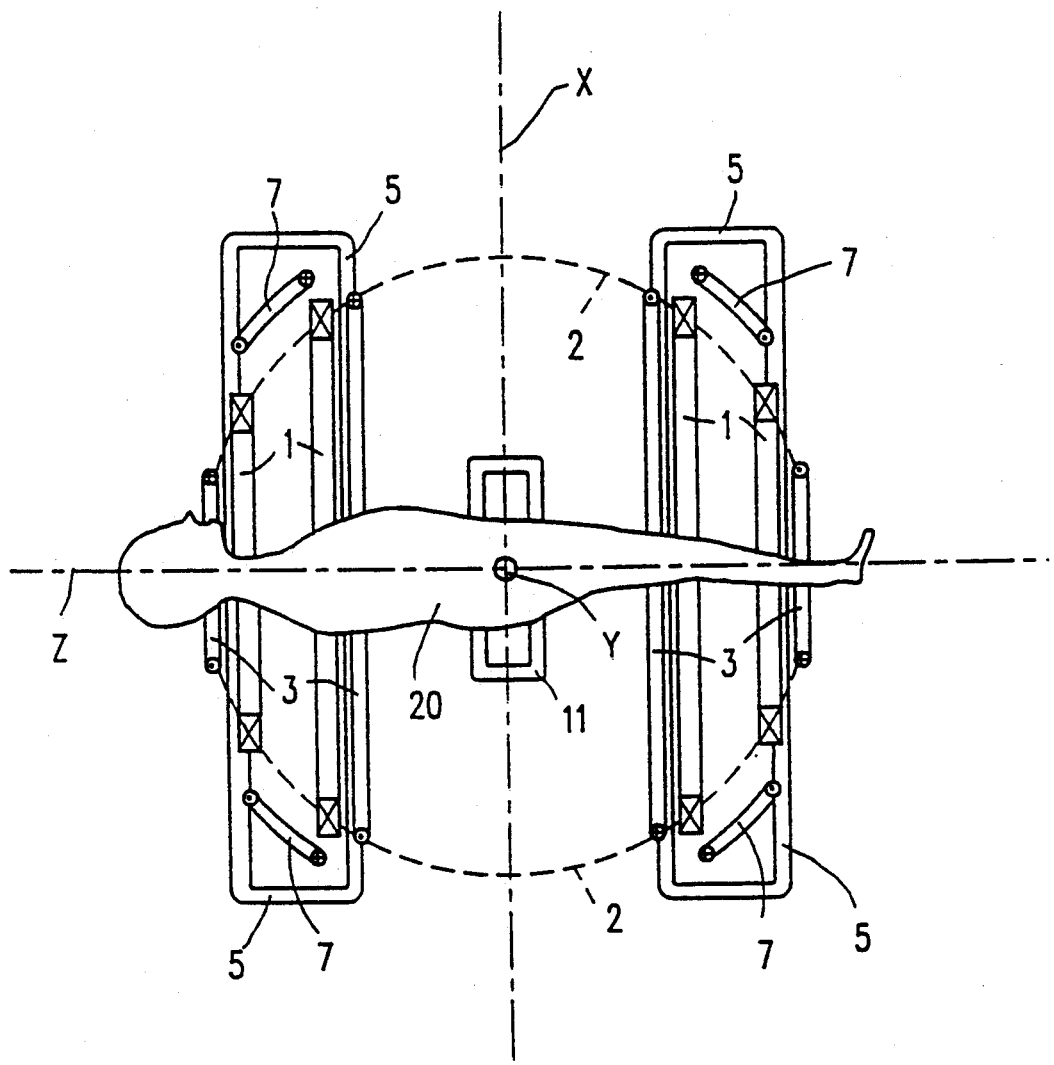
FIG. 1 shows a magnetic resonance tomography apparatus in which the invention can be used.

The magnetic resonance examination apparatus which is diagrammatically shown in FIG. 1 comprises a system which consists of four coils 1 and which serves to generate a uniform, steady magnetic field whose strength may be in the order of magnitude from some tenths of Tesla to some Tesla. This field extends in the z-direction of a cartesian coordinate system. The coils 1, being concentrically arranged with respect to the z-axis, may be situated on a spherical surface 2. The patient 20 to be examined is within these coils.

In order to generate a magnetic field $G_z$ which extends in the z-direction and which linearly varies in this direction, four coils 3 are preferably arranged on the same spherical surface 2. There are also provided four coils 7 which generate a magnetic gradient field $G_x$ (i.e. a magnetic field whose strength varies linearly in one direction) which also extends in the z-direction but whose gradient extends in the x-direction. A magnetic gradient field $G_y$ which extends in the z-direction and which has a gradient in the y-direction is generated by four coils 5 which may be identical to the coils 7 but which are offset 90° in space with respect thereto. Only two of these four coils are shown in FIG. 1.

Because each of the three coil systems comprising coils 3, 5 and 7 for generating the magnetic gradient fields $G_z$, $G_y$, $G_x$ is symmetrically arranged with respect to the spherical surface 2, the field strength in the sphere center, at the same time being the origin of the cartesian x-y-z coordinate system, is determined exclusively by the steady, uniform magnetic field of the coil system 1.

Furthermore, an RF coil 11 is arranged symmetrically with respect to the plane z=0 of the coordinate system, which RF coil is constructed so that it generates an essentially uniform RF magnetic field which extends in the x-direction, i.e. perpendicular to the direction of the steady, uniform magnetic field. During each RF pulse the RF coil receives an RF signal, usually amplitude-modulated current from an RF generator. Subsequent to the three RF pulses of each sub-sequence, the RF coil 11 receives the spin resonance signal generated in the examination zone. However, a separate RF receiver coil can be used instead.

Figure 2:
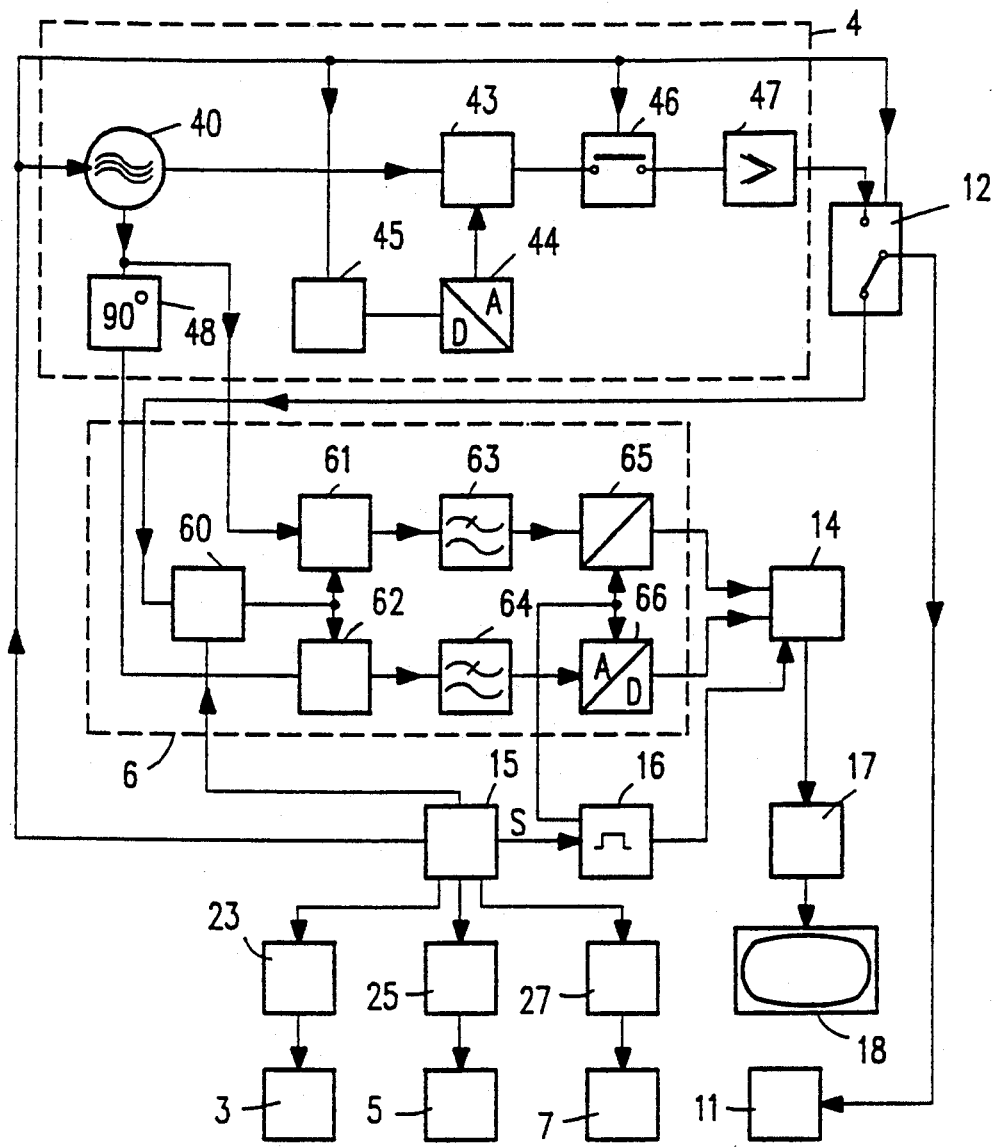
FIG. 2 shows the block diagram of such an apparatus.

FIG. 2 shows a simplified block diagram of the described magnetic resonance examination apparatus. Via a switching device 12, the RF coil 11 is connected to an RF generator 4 on the one side and to an RF receiver 6 on the other side.

The RF generator 4 comprises an RF oscillator 40 whose frequency can be digitally controlled by a control unit 15 and which generates oscillations of a frequency in the vicinity of the Larmor frequency of the nuclei to be excited at the field strength generated by the coils 1. As is known, the Larmor frequency f is calculated as f=cB, where B is the magnetic induction in the steady, uniform magnetic field and c is the gyromagnetic ratio which, for example for protons amounts to 42.56 MHz/T. The output of the oscillator 40 is connected to an input of a mixing stage 43. The mixing stage 43 receives a second input signal from a digital-to-analog converter 44 whose output is connected to a digital memory 45. A series of digital data words representing an envelope signal is read from the memory under the control of the control device 15.

The mixing stage 43 processes the input signals applied thereto in such a manner that the carrier oscillation modulated with the envelope signal appears at its output. The output signal of the mixing stage 43 is applied, via a switch 46 which is controlled by the control device 15, to an RF power amplifier 47 whose output is connected to the switching device 12. The latter device is also controlled by the control device 15.

Current generators 23, 25 and 27 supply the gradient coil systems 3, 5 and 7, respectively, with a current whose variation in time can be controlled by the control unit 15.

The receiver 6 comprises an RF amplifier 60 which is connected to the switching device and which receives the echo signal each time induced in the RF coil 11; to this end, the switching device should be in the corresponding position. The amplifier 60 comprises a muting input which is controlled by the control device 15 and via which it can be blocked so that the gain is substantially zero. The output of the amplifier is connected to the first inputs of two multiplying mixing stages 61 and 62, each of which delivers an output signal corresponding to the product of its input signals. The second inputs of the mixing stages 61 and 62 receive a signal having the frequency of the oscillator 40, a phase shift of 90° existing between the signals at the two inputs. This phase shift is produced by a 90° phase shifter 48 whose output is connected to the input of the mixing stage 62 and whose input is connected to the input of the mixing stage 61 and to the output of the oscillator 40.

The output signals of the mixing stages 61 and 62 are applied to a respective analog-to-digital converter 65, 66, via low-pass filters 63 and 64 which suppress the frequency supplied by the oscillator 40 as well as all higher frequencies and which conduct low-frequency components. The analog-to-digital converters convert the analog signals of the circuit 61 . . . 64, constituting a quadrature demodulator, into digital data words which are applied to the memory 14. The analog-to-digital converters 65 and 66 and the memory 14 receive their clock pulses from a clock pulse generator 16 which can be blocked and enabled by the control device 15, via a control lead, so that the signals supplied by the RF coil 11 and transposed to the low-frequency range can be converted into a series of digital data words for storage in the memory 14 only during a measuring inteval defined by the control device.

The data words or sampling values stored in the memory 14 are applied to a computer 17. The sampling values can be defined by three parameters: their position in time within the spin resonance signal, the magnitude of a first magnetic gradient field applied between the first and the second RF pulse in the sequence for which the spin resonance signal was received, and the magnitude of a second magnetic gradient field which was applied during the same period of time. Via a three-dimensional Fourier transformation in respect of these three parameters, performed in the computer 17, for a slice within the object to be examined the two-dimensional spatial distribution of the nuclear magnetization is obtained and for each zone within this layer the spectral distribution of the nuclear magnetization is obtained. The distribution thus obtained is applied to a suitable display unit, for example a monitor 18.

Figure 3:
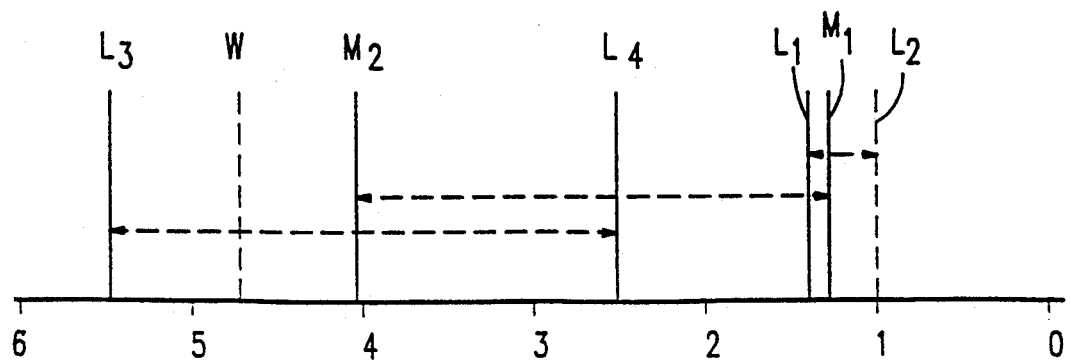
FIG. 3 shows a frequency diagram containing the relevant spectral components of fat, water and lactic acid.

FIG. 3 shows the position of the components which are of essential importance for clinical detection of lactic acid on a frequency scale indicating the deviation from the Larmor frequency of TMS (tetramethyl silane) (in ppm). The Larmor frequency of TMS is thus defined as being zero. Above the zero point, FIG. 3 first shows a line $L_2$ stemming from a $CH_3$ group of the fat molecule. This group is coupled to a $CH_2$ group having a frequency line $L_1$ at approximately 1.4 ppm. The broken line between $L_1$ and $L_2$ symbolizes this scalar coupling. In the case of suitable excitation, the molecular group associated with the line $L_1$ exhibits a double-quantum transition; it is not possible to produce such a transition for the line $L_2$. The line $L_2$ thus disappears in the double-quantum spectrum so that it is denoted merely by a broken line in FIG. 3.

In the direct vicinity of the line $L_1$ there is situated a line $M_1$ (at approximately 1.33 ppm) which stems from the $CH_3$ group of lactate. A scalar coupling exists between this $CH_3$ group and a CH group of the lactic acid molecule whose Larmor frequency is situated at 4.1 ppm. Both frequency lines appear in the double-quantum spectrum. The frequency line W of water-bound protons is situated at approximately 4.7 ppm. These protons per se cannot assume a double-quantum state, which is why the frequency line W is also represented by a broken line, but the water component whose intensity in the bilogical tissue is several powers of ten higher than that of all other components, cannot be fully suppressed, so that this line also appears in the double-quantum spectrum. Also shown are further lines $L_3$ and $L_4$ which stem from molecular groups of the fat molecule.

Even when it has been suppressed by a factor of, for example 1000 by a method set forth, the water component W in biological tissue is still so intense that the lactic acid component $M_2$ in its vicinity in the double quantum spectrum cannot be separated therefrom. The lactic acid component $M_1$ is situated so near to the fat component $L_1$, that separate measurement is again impossible when the examination zone contains a substantial fat component, for example as in muscular tissue. Consequently, unambiguous determination of the lactic acid contents from a measurement of the component $M_1$ is possible only when the fat component $L_1$ which directly neighbors it in respect of frequency is strongly suppressed.

Figure 4:
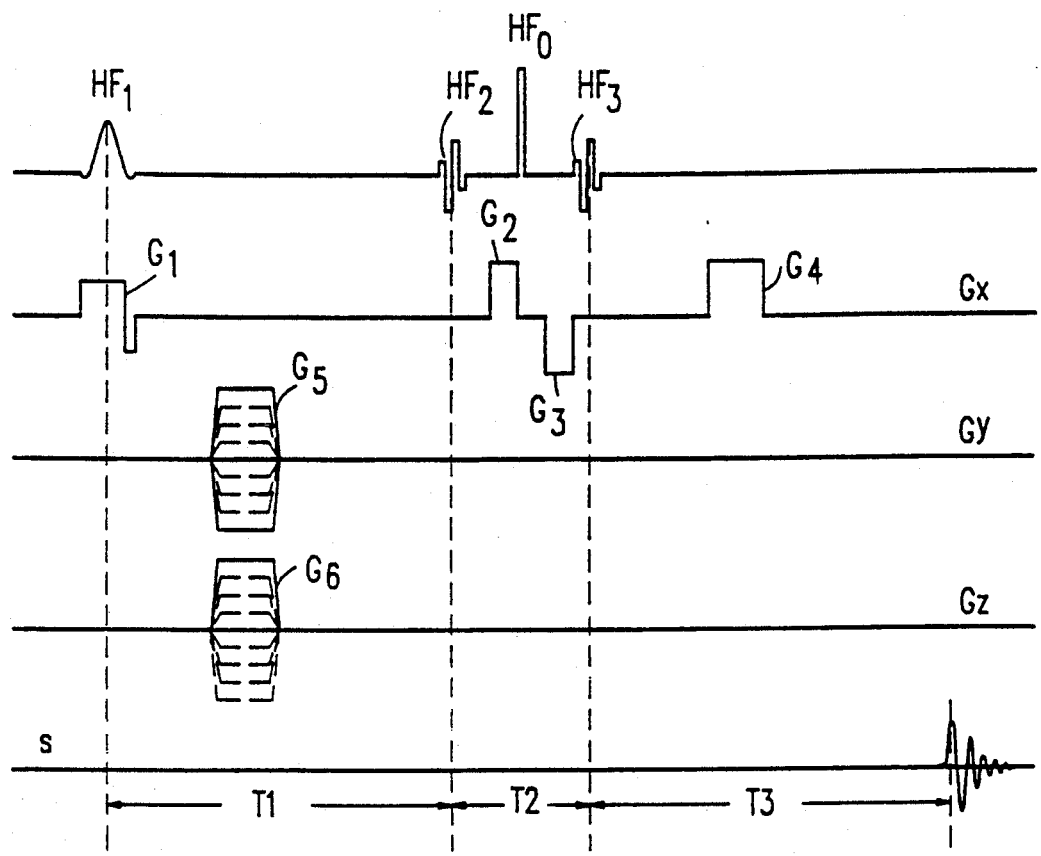
FIG. 4 shows the variation in time of the signals in a sequence in accordance with the invention.

Such suppression is achieved by a sequence whose variation in time is shown in FIG. 4. The first line of FIG. 4 represents the position in time of the magnetic RF pulses generated by the RF coil 11. The second, the third and the fourth line represent the position in time of the magnetic gradient fields which are generated by means of the gradient coils 7,5 and 3 and whose gradients $G_x$, $G_y$ and $G_z$, respectively, extend in the x-direction, the y-direction and the z-direction, respectively. The fifth line represents the spin resonance signal appearing. Upon detection of this signal, the control unit 15 enables the clock pulse generator 16 so that the spin resonance signals supplied by the RF coil 11 and transposed to the low-frequency range are converted into a series of digital data words for storage in the memory 14, after which they are subjected to a Fourier transformation.

The first RF pulse $HF_1$ is a slice-selective 90° RF pulse, during this pulse there being applied a magnetic gradient field $G_1$ having a gradient extending in the x-direction. As a result, the nuclear magnetization of the frequency component shown in FIG. 3 is excited in a slice extending perpendicular to the x-axis and having a thickness which depends on the bandwidth of the RF pulse $HF_1$ and on the magnitude of the gradient $G_1$. Instead of extending in the x-direction, the gradient $G_1$ could also extend in the y-direction or in the z-direction. The nuclear magnetization would then be excited in a slice extending perpendicular to the y-axis and the z-axis, repectively.

At a distance in time T1 from the first RF pulse $HF_1$, a second RF pulse $HF_2$ is generated. T1 then corresponds to the value $\frac{1}{2}J$, where J is the scalar coupling constant of lactic acid or fat, or to an n-multiple thereof, n being an odd number. For n=1, T1 amounts to approximately 68 ms.

The second RF pulse $HF_2$ is a frequency-selective RF pulse which acts as a 90° pulse for the component $M_2$ coupled to the lactate component $M_1$ to be detected, and as a 0° pulse for the lipid component $L_2$ (and hence also for $L_1$ and $M_1$), i.e. these components are not influenced thereby. As a result, this pulse brings only the lactic acid components $M_1$ and $M_2$ (because of the scalar coupling to $M_1$) in a double quantum state, but not the lipid component $L_1$.

Figure 5:
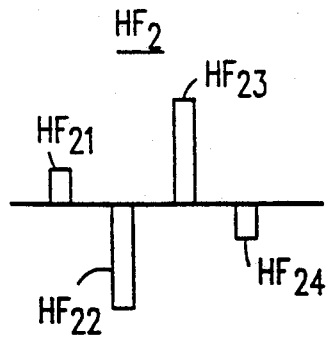
FIG. 5 shows the variation in time of the second RF pulse.

FIG. 5 shows the frequency-selective second RF pulse $HF_2$. This is a so-called binomial RF pulse. As is known, a binomial RF pulse consists of a series of sub-pulses whose associated flip angles (being the angle wherethrough the nuclear magnetization is rotated out of the rest state by such a sub-pulse) relate to one another as the binomial coefficients.

The distance in time between two successive sub-pulses is chosen so that an oscillation whose frequency corresponds to the difference between the frequency to be excited and the frequency to be suppressed has changed its phase by exactly zero or an odd multiple thereof within this period of time. The central frequency of this sub-pulse coincides with one of the two said frequencies.

FIG. 5 shows the frequency-selective RF pulse $HF_2$ as a 1, 3−, 3, 1−RF pulse which consists of the four sub-pulses $HF_{21}$ ... $HF_{24}$. The central frequency of each of these RF pulses corresponds to the Larmor frequency of the fat component $L_2$. The second sub-pulse $HF_{22}$ and the fourth sub-pulse $HF_{24}$ have a phase position which opposes that of the sub-pulses $HF_{21}$ and $HF_{23}$, respectively. The distance in time between each time two successive sub-pulses amounts to $\frac{1}{2}df$, where df is the difference frequency between $M_2$ and $L_2$. For a magnetic flux density of the uniform, steady magnetic field amounting to 2T, therefore, a distance of approximately 1.9 ms occurs between the sub-pulses. The first sub-pulse $HF_{21}$ and the last sub-pulse $HF_4$ have a flip angle of each time 11.25°, the flip angle of the RF pulses $HF_{22}$ and $HF_{23}$ being three times greater. For nuclear spins whose Larmor frequency corresponds to the central frequency of the sub-pulses (such as, for example for $L_2$), the effects of the RF pulses $HF_{21}$ and $HF_{24}$ or $HF_{22}$ and $HF_{23}$ compensate for one another. For the component $M_2$, however, the effect of the pulses $HF_{21}$ ... $HF_{24}$ are summed, so that for this component the flip angles linked to the individual sub-pulses are summed and the effect of a 90° RF pulse is obtained.

The sub-pulses $HF_{22}$ and $HF_{24}$ may also have the same phase position as the sub-pulses $HF_{21}$ and $HF_{23}$. In that case the central frequency of these sub-pulses should coincide with the frequency of the component $M_2$.

The second RF pulse $HF_2$ is succeeded by a third RF pulse $HF_3$ at a distance in time $T_2$. The latter pulse serves to bring the double quantum transitions caused by $HF_2$ in a state in which they generate a spin resonance signal or contribute thereto. The RF pulse $HF_3$ may be a hard (broadband) pulse, but is preferably also a frequency-selective pulse, i.e. so that it acts as a 90° pulse for the frequency component $M_2$. The amplitude of the lactate signal is thus doubled.

The pulse $HF_3$ may vary in time in the same way as $HF_2$ which acts as a 90° pulse for $M_2$ and as a 0° pulse for $L_2$, as shown in FIG. 4. Halfway between the second RF pulse $HF_2$ and are third RF pulse $HF_3$ there may be provided a 180° RF pulse $HF_0$. This pulse has a refocusing effect, so that the amplitude of the spin resonance signal is increased.

If no special steps were taken, after the third RF pulse $HF_3$ single quantum coherences would be observed in addition to the double-quantum coherences brought in an observable state. These single-quantum coherences are suppressed in that between the RF pulses $HF_2$ and $HF_3$ as well as after the RF pulse $HF_3$ magnetic gradient fields $G_2$, $G_3$ and $G_4$ are applied, the gradients thereof extending in the same direction and in opposite directions, respectively. Between the RF pulses $HF_2$ and $HF_3$ the magnetic gradient field is split into two parts $G_2$ and $G_3$ which act before and after the 180° RF pulse $HF_0$, respectively, and which are of opposite sign. The time integrals over $G_2$ and $G_3$ may have the same absolute value, but other subdivisions are also feasible. The magnetic gradient field $G_4$ must have the same sign as $G_2$ for the sequence shown in FIG. 4, and the time integral over $G_4$ must be twice as great as the time integral over the sum of the amounts of $G_2$ and $G_3$.

When $HF_0$ is omitted and $HF_3$ has the same variation in time as $HF_2$, these gradients have the opposite sign. In that case the amount of the time integral over the relevant gradient field in the interval between $HF_2$ and $HF_3$ must equal to half the amount of the time integral over the gradient field after $HF_3$.

The pulse $HF_3$ can also be frequency selective so that it acts as a 90° pulse for $M_2$ and as a 180° pulse for $M_1$. Because the flip angle of the third RF pulse $HF_3$ around the frequency of the component $M_1$ cannot change abruptly, the third RF pulse also acts as a 180° pulse for the fat components $L_1$ and $L_2$ neighboring $M_1$ in respect of frequency. Thus, the fat component $L_2$ does not "see" a 90° pulse but rather a 180° pulse, so that any double quantum coherence states of the fat components are not brought in an observable quantum coherence state.

In this case the 180° RF pulse $HF_0$ providing refocusing may not be situated halfway between $HF_2$ and $HF_3$, but must succeed the first RF pulse at the same distance in time as that between the second pulse and the third pulse $HF_3$. The time integral over the gradient field applied between $HF_2$ and $HF_3$ should then have the same sign and should amount to half the time integral after the third RF pulse $HF_3$.

Figure 6:
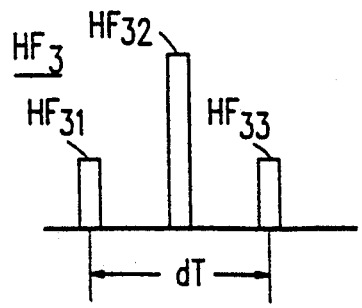
FIG. 6 shows the variation in time of the third RF pulse.

FIG. 6 shows an RF pulse $HF_3$ which acts as a 90° pulse for $M_2$ and as a 180° pulse for $M_1$. The RF pulse $HF_3$ thus comprises two identical 45° sub-pulses $HF_{31}$ and $HF_{33}$ between which (halfway) a "hard" and hence broad-band 90° sub-pulse $HF_{32}$ occurs. For the distance in time dT between the two sub-pulses $HF_{31}$ and $HF_{33}$ the relation $dT = n/2 \, df$ holds, where n is an odd number and df is the frequency difference between the Larmor frequencies of the components $M_1$ and $M_2$ (approximately 235 Hz for a steady field of 2T). When the central frequency of the sub-pulses $HF_{31}$ and $HF_{33}$ coincides with the Larmor frequency of the lactic acid component $M_1$, all sub-pulses should have the same phase position. The effects of the sub-pulses $HF_{31}$ and $HF_{33}$ then compensate for one another for the lactic acid component $M_2$ and are summed for the lactic acid component $M_1$, so that the latter component experiences these two sub-pulses as a 90° pulse. In addition, the sub-pulse $HF_{32}$ acts on the components and all other components of FIG. 3. Thus, the RF pulse $HF_3$ acts as a 90° pulse for the component $M_2$ and as a 180° pulse for the component $M_2$, so that the amplitude of the double-quantum transition $M_1$ in the spin resonance signal is doubled.

It is alternatively possible to choose the central frequency of the sub-pulses $HF_{31}$ and $HF_{33}$ to correspond to the frequency component $M_2$ (approximately 4.1 ppm). In that case the phase of the sub-pulse $HF_{31}$ should lead the phase of the sub-pulse $HF_{32}$ by 90° should lag the phase of $HF_{32}$.

The frequency dependency of the flip angle of $HF_3$ between $M_2$ and $M_1$ varies cosinusoidally from 90° to 180°. Consequently, the flip angle for the fat components $L_1$ and $L_2$, being comparatively close to $M_1$ respect of frequency, is substantially 180°. In order to ensure that the component $L_2$ does not "see" a 90° pulse, any double quantum transitions for the fat component $L_1$ are brought, be it to a negligibly small extent, in a single-quantum state in which they can be observed.

The nuclear spin systems changed from a double quantum state to a single quantum state by the third RF pulse $HF_3$ produce a spin resonance signal which reaches its maximum value a period of time $T_3 = (2m + 1)/2J$ after the third RF pulse, where m is an integer which is not smaller than zero. At that instant the sampling of the spin resonance signal shown on the fifth line of FIG. 4 commences, i.e. the control unit 15 (FIG. 2) then enables the pulse generator 16 so that the spin resonance signal is digitized and stored.

In order to obtain a spatial representation, magnetic gradient fields $G_5$ and $G_6$ having gradients extending in the y-direction and the z-direction, respectively, i.e. perpendicular to the slice excited by $HF_1$ and $G_1$, are generated, either the gradient $G_5$ or the gradient $G_6$ being varied from one sequence to another so that the spin resonance signal $s(t, G_5, G_6)$ depends on the parameters $G_5$ and $G_6$ as well as on the position in time t of the relevant sampling value within a spin resonance signal.

When these values are subjected to a triple Fourier transformation in respect of the three parameters, a data set is obtained which represents the nuclear magnetization in the excited slice as a function of location, for each point y, z also the spectral distribution of the nuclear magnetization being obtained.

When the gradient fields $G_5$, $G_6$ are generated prior to the RF pulses $HF_0$, $HF_2$ and $HF_3$, as in the present embodiment, the undesirable FID signals generated by $HF_2$, $HF_3$ and $HF_0$ are not influenced by the gradients $G_5$ and $G_6$. The error thus produced, therefore, appears in the center of the image after the Fourier transformation. This error can be shifted to the corners of the image by suitable phase cycling where, for example during each second sequence the phase of the first RF pulse or the receiving phase is inverted.

FIG. 4 shows a sequence for two-dimensional spectroscopic imaging. Instead, however, one-dimensional imaging is also possible where one of the gradients $G_5$ or $G_6$ (and its variations during the successive sequences) can being dispensed with. In that case $HF_0$ must also be slice-selective in order to ensure that the spectral distribution can be reproduced along a strip extending in the y-direction or the z-direction.

It is also possible to determine, in addition to the spectral distribution, the spatial distribution of the nuclear magnetization in a three-dimensional fashion. In that case $HF_1$ may be a hard (non-slice selective) RF pulse and between $HF_1$ and $HF_2$ an additional magnetic gradient field comprising a gradient $G_x$ extending in the x-direction must be applied, said gradient being varied from one sequence to another. The desired distribution is then produced by a four-fold Fourier transformation.

We claim:

1. A magnetic resonance spectroscopy method comprising applying a plurality of sequences to an examination zone, in the presence of a uniform, steady magnetic field, each sequence comprising at least three 90° RF pulses, applying between the second and the third RF pulse and after the third RF pulse magnetic gradient fields having an amplitude and duration such that spin resonance signals occurring subsequent to the third RF pulse are determined exclusively by double quantum coherence, applying between the three RF pulses at least one magnetic gradient field, varying the time integral over at least one of these gradient fields during repetition of the sequences, the second RF pulse being frequency-selective to reduce a first lipid component in the vicinity of a first lactate component so that it excites the nuclear magnetization of a second lactate component coupled to the first lactate component but not the nuclear magnetization of a second lipid component coupled to the first lipid component.

2. A magnetic resonance spectroscopy method as claimed in claim 1 wherein certain of the gradients provide phase encoding, the method applying the certain gradients between the first and the second RF pulses.

3. A magnetic resonance spectroscopy method as claimed in claim 1 including applying a 180° pulse between the second RF pulse and the third RF pulse.

4. A magnetic resonance spectroscopy method as claimed in claim 3 wherein during the interval between the second and the third RF pulse generating a magnetic gradient field having opposed gradients before and after the 180° pulse, the sum of the absolute values of the time integrals over these gradient fields amounting to half the time integral over the magnetic gradient field which is generated after the third RF pulse and whose gradient extends in the same direction and in the opposite direction, respectively.

5. A magnetic resonance spectroscopy method as claimed in claim 1 wherein the third RF pulse is frequency-selective so that it acts as a 90° pulse for the second lactate component coupled to the first lactate component and as a 0° pulse for second lipid component coupled to the first lipid component, the gradient of the magnetic gradient field first applied after the second RF pulse having the same polarity as the gradient of the magnetic gradient field applied after the third RF pulse.

6. A magnetic resonance spectroscopy method as claimed in claim 1 including generating after the first RF pulse a 180° pulse which is situated at a distance in time from the first RF pulse which distance in time is equal to the distance in time between the third RF pulse and the second RF pulse, the gradient of the magnetic gradient field first applied after the second RF pulse extending in the opposite direction with respect to the gradient of the magnetic gradient field applied after the third RF pulse, the third RF pulse being frequency selective so that it acts as a 90° pulse for the second component coupled to the first lactate component and as a 180° pulse for the first lactate component.

7. A magnetic resonance spectroscopy method as claimed in claim 1 wherein one of the first RF pulse and the 180° pulse is slice-selective.

8. A device for magnetic spectroscopy of an object in an examination zone comprising a magnet for generating a uniform, steady magnetic field, an RF coil system for generating RF signals and for receiving spin resonance signals, an RF transmitter for generating sequences comprising at least three RF pulses, the second pulse of which is frequency-selective so that it acts as a 90° pulse for a lactate component and as a 0° pulse for a fat component, an RF receiver for receiving the spin resonance signals appearing after the third RF pulse, and means for determining the spectrum and the nuclear magnetization distribution from the spin resonance signals.

9. A magnetic resonance spectroscopy method as claimed in claim 2 including applying a 180° pulse between the second RF pulse and the third RF pulse.

10. A magnetic resonance spectroscopy method as claimed in claim 9, wherein during the interval between the second and the third RF pulse generating a magnetic gradient field having opposed gradients before and after the 180° pulse, the sum of the absolute values of the time integrals over these gradient fields amounting to half the time integral over the magnetic gradient field which is generated after the third RF pulse and whose gradient extends in the same direction and in the opposite direction, respectively.

11. A magnetic resonance spectroscopy method as claimed in claim 9 wherein the third RF pulse is frequency-selective so that it acts as a 90° pulse for the second lactate component coupled to the first lactate component and as a 0° pulse for the second lipid component coupled to the first lipid component the gradient of the magnetic field first applied after the second RF pulse having the same polarity as the gradient of the magnetic gradient field applied after the third RF pulse.

12. A magnetic resonance spectroscopy method as claimed in claim 10 wherein the third RF pulse is frequency-selective so that it acts as a 90° pulse for the second lactate component coupled to the first lactate component and as a 0° pulse for the second lipid component coupled to the first lipid component the gradient of the magnetic field first applied after the second RF pulse having the same polarity as the gradient of the magnetic gradient field applied after the third RF pulse.

13. A magnetic resonance spectroscopy method as claimed in claim 11 wherein the third RF pulse is frequency-selective so that it acts as a 90° pulse for the second lactate component coupled to the first lactate component and as a 0° pulse for the second lipid component coupled to the first lipid component the gradient of the magnetic field first applied after the second RF pulse having the same polarity as the gradient of the magnetic gradient field applied after the third RF pulse.

14. A magnetic resonance spectroscopy method as claimed in claim 2 including generating after the first RF pulse a 180° pulse which is situated at a distance in time from the first RF pulse which distance in time is equal to the distance in time between the third RF pulse and the second RF pulse, the gradient of the magnetic gradient field first applied after the second RF pulse extending in the opposite direction with respect to the gradient of the magnetic gradient field applied after the third RF pulse, the third RF pulse being frequency selective so that it acts as a 90° pulse for the second component coupled to the first lactate component and as a 180° pulse for the first lactate component.

15. A magnetic resonance spectroscopy method as claimed in claim 2 wherein one of the first RF pulse and the 180° pulse is slice-selective.

16. A magnetic resonance spectroscopy method as claimed in claim 14 wherein one of the first RF pulse and the 180° pulse is slice-selective.

17. A magnetic resonance spectroscopy method as claimed in claim 3 wherein one of the first RF pulse and the 180° pulse is slice-selective.

18. A magnetic resonance spectroscopy method as claimed in claim 4 wherein one of the first RF pulse and the 180° pulse is slice-selective.

19. A magnetic resonance spectroscopy method as claimed in claim 5 wherein one of the first RF pulse and the 180° pulse is slice-selective.

20. A magnetic resonance spectroscopy method as claimed in claim 6 wherein one of the first RF pulse and the 180° pulse is slice-selective.

* * * * *